(12) United States Patent
Kang et al.

(10) Patent No.: US 10,424,762 B2
(45) Date of Patent: Sep. 24, 2019

(54) METHOD FOR MANUFACTURING TRANSPARENT DISPLAY DEVICE

(71) Applicant: Samsung Display Co., Ltd., Yongin-si, Gyeonggi-do (KR)

(72) Inventors: Byung Hoon Kang, Hwaseong-si (KR); Seung Jun Moon, Cheonan-si (KR); Hee Kyun Shin, Incheon (KR); Min-Woo Lee, Seoul (KR); Woo Jin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/155,413

(22) Filed: Oct. 9, 2018

(65) Prior Publication Data
US 2019/0189973 A1    Jun. 20, 2019

(30) Foreign Application Priority Data
Dec. 15, 2017   (KR) .................. 10-2017-0173229

(51) Int. Cl.
*H01L 51/56*   (2006.01)
*H01L 51/52*   (2006.01)
*H01L 51/00*   (2006.01)

(52) U.S. Cl.
CPC .......... *H01L 51/56* (2013.01); *H01L 51/0097* (2013.01); *H01L 51/5237* (2013.01)

(58) Field of Classification Search
CPC ..... H01J 51/0097; H01J 51/5237; H01J 51/56
See application file for complete search history.

(56) References Cited

U.S. PATENT DOCUMENTS

| | | | | |
|---|---|---|---|---|
| 2004/0239827 | A1* | 12/2004 | Yamazaki | H01L 27/1214 349/45 |
| 2015/0069354 | A1* | 3/2015 | Helander | H01L 31/022466 257/40 |
| 2016/0268555 | A1* | 9/2016 | Nishimura | H01L 51/5275 |
| 2018/0287080 | A1* | 10/2018 | Wang | H01L 51/0097 |

FOREIGN PATENT DOCUMENTS

| | | |
|---|---|---|
| KR | 10-2010-0124014 A | 11/2010 |
| KR | 10-1004299 | 12/2010 |
| KR | 10-1398618 | 5/2014 |
| KR | 10-2016-0049382 A | 5/2016 |
| WO | WO 2015/030457 A1 | 3/2015 |

* cited by examiner

*Primary Examiner* — Anne M Hines
(74) *Attorney, Agent, or Firm* — Lewis Roca Rothgerber Christie LLP (57) ABSTRACT

A method for manufacturing a transparent display device includes: providing a transparent flexible substrate on a support substrate; forming a display unit on a front side of the transparent flexible substrate; separating the transparent flexible substrate from the support substrate; and cleaning a rear side of the transparent flexible substrate with plasma.

11 Claims, 13 Drawing Sheets

| Transmittance | Before cleaning | After cleaning | △Transmittance |
|---|---|---|---|
| 140mJ/cm² SLP | 80.10 % | 80.25 % | 0.15 |
| 170mJ/cm² SLP | 77.97 % | 80.23 % | 2.26 |
| 200mJ/cm² SLP | 74.83 % | 80.09 % | 5.26 |

FIG. 7D

| Yellow Index | Before cleaning | After cleaning | △YI |
|---|---|---|---|
| 140mJ/cm² SLP | 27.71 | 26.34 | 1.37 |
| 170mJ/cm² SLP | 29.39 | 26.62 | 2.77 |
| 200mJ/cm² SLP | 31.71 | 26.85 | 4.86 |

| Transmittance | Before cleaning | After cleaning | △Transmittance |
|---|---|---|---|
| Non-laser attachment or detachment (GO) | 71.40 % | 79.89 % | 8.49 |

FIG. 11C

| Yellow Index | Before cleaning | After cleaning | △YI |
|---|---|---|---|
| Non-laser attachment or detachment (GO) | 28.18 | 26.58 | 1.60 |

METHOD FOR MANUFACTURING TRANSPARENT DISPLAY DEVICE

CROSS-REFERENCE TO RELATED APPLICATION

This application claims priority to and the benefit of Korean Patent Application No. 10-2017-0173229, filed on Dec. 15, 2017 in the Korean Intellectual Property Office, the entire content of which is incorporated herein by reference.

BACKGROUND

1. Field

Aspects of embodiments of the present disclosure relate to a method for manufacturing a transparent display device.

2. Description of the Related Art

In general, examples of display devices include an organic light emitting display device and a liquid crystal display device.

The organic light emitting display device includes a substrate and an organic light emitting element.

Recently, transparent display devices including a transparent flexible substrate and an organic light emitting element have been applied to front windshields of vehicles or mobile terminals, for example.

The above information disclosed in this Background section is only for enhancement of understanding of the background and, therefore, it may contain information that does not form the prior art that is already known in this country to a person of ordinary skill in the art.

SUMMARY

According to aspects of embodiments of the present disclosure, a method for manufacturing a transparent display device and for manufacturing a flexible transparent display device is provided.

According to one or more exemplary embodiments of the present invention, a method for manufacturing a transparent display device includes: providing a transparent flexible substrate on a support substrate; forming a display unit on a front side of the transparent flexible substrate; separating the transparent flexible substrate from the support substrate; and cleaning a rear side of the transparent flexible substrate with plasma.

The separating of the transparent flexible substrate may include irradiating laser beams to an interface of the support substrate and the transparent flexible substrate through the support substrate.

The transparent flexible substrate may be colored, and an energy density of the laser beams may be 120 mJ/cm$^2$ to 200 mJ/cm$^2$.

The transparent flexible substrate may be colorless, and an energy density of the laser beams may be 250 mJ/cm$^2$ to 330 mJ/cm$^2$.

The cleaning of the rear side of the transparent flexible substrate with plasma may include removing soot provided on the rear side of the transparent flexible substrate.

The method may further include providing a sacrificial layer on the support substrate such that the sacrificial layer may be provided between the support substrate and the transparent flexible substrate.

The separating of the transparent flexible substrate may include separating the sacrificial layer from the support substrate.

The sacrificial layer may include a graphene oxide or carbon nanotubes.

The cleaning of the rear side of the transparent flexible substrate with plasma may include removing a remnant of the sacrificial layer provided on the rear side of the transparent flexible substrate.

The cleaning with plasma may be performed by using a plasma torch using clean dry air (CDA) including $O_2$.

A power of the plasma torch may be 900 W to 1300 W.

According to an aspect of exemplary embodiments, the method for manufacturing a transparent display device and for manufacturing a flexible transparent display device is provided.

BRIEF DESCRIPTION OF THE DRAWINGS

FIG. 2 to FIG. 6 show a method for manufacturing a transparent display device according to an exemplary embodiment.

DETAILED DESCRIPTION

Embodiments of the present disclosure will be described more fully herein with reference to the accompanying drawings, in which some exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

The size and thickness of each configuration shown in the drawings may be arbitrarily shown for better understanding and ease of description, and the present invention is not limited thereto. In the drawings, thicknesses of layers, films, panels, regions, etc., may be exaggerated for clarity. For better understanding and ease of description, the thicknesses of some layers and areas may be exaggerated.

It is to be understood that when an element, such as a layer, film, region, or substrate is referred to as being "on" another element, it may be directly on the other element or one or more intervening elements may also be present. In contrast, when an element is referred to as being "directly on" another element, there are no intervening elements present. The words "on" or "above" mean positioned on or above the object portion, and do not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

A method for manufacturing a transparent display device according to an exemplary embodiment will now be described with reference to FIG. 1 to FIG. 6.

Figure 1:
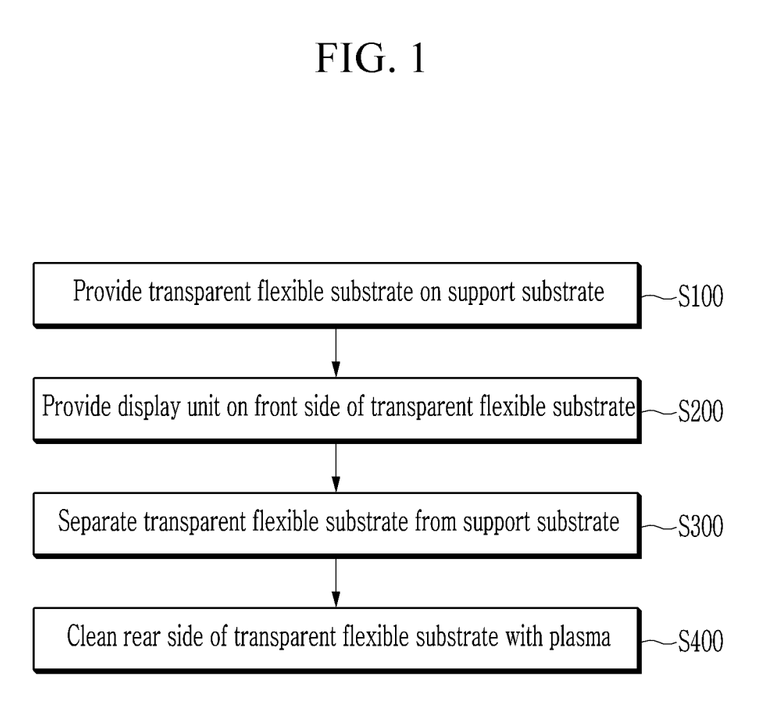
FIG. 1 shows a flowchart of a method for manufacturing a transparent display device according to an exemplary embodiment.

FIG. 1 shows a flowchart of a method for manufacturing a transparent display device according to an exemplary embodiment.

FIG. 2 to FIG. 6 show a method for manufacturing a transparent display device according to an exemplary embodiment.

Figure 2:
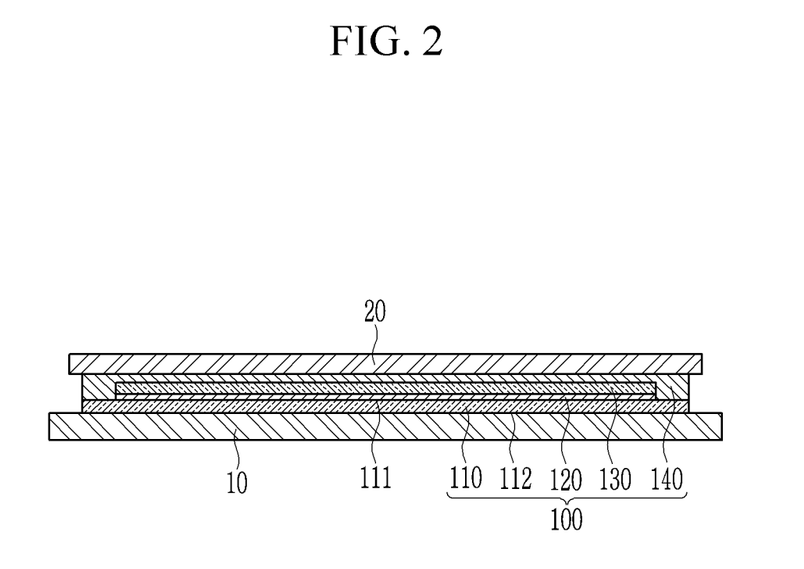

Referring to FIG. 1 and FIG. 2, a transparent flexible substrate 110 is provided on a support substrate 10 (S100).

In an embodiment, when the transparent flexible substrate 110 is provided on the support substrate 10, the support substrate 10 may be a transparent and rigid substrate. In an embodiment, the support substrate 10 may include glass.

In an embodiment, the transparent flexible substrate 110 may include a transparent polymer. For example, the transparent flexible substrate 110 may include at least one of polyamide, polyimide, epoxy, polysiloxane, and cellulose acetate. In an embodiment, the transparent flexible substrate 110 may be formed by coating a transparent polymer fluid on the support substrate 10, but is not limited thereto.

A display unit 130 is formed on a front side 111 of the transparent flexible substrate 110 (S200).

In an embodiment, a driver 120, the display unit 130, and an encapsulation layer 140 are sequentially formed on the front side 111 of the transparent flexible substrate 110.

The driver 120 includes a plurality of thin film transistors, at least one capacitor, and a plurality of wires connected to the thin film transistors and the at least one capacitor. The driver 120 may be formed to have any of various structures known to a person skilled in the art.

In an embodiment, the display unit 130 includes an organic light emitting element including a first electrode, a second electrode provided on the first electrode, and an organic emission layer provided between the first electrode and the second electrode. The display unit 130 may have any of various structures known to a person skilled in the art.

The display unit 130 includes an organic light emitting element according to an exemplary embodiment; however, the display unit 130 may include any of various image displaying means, such as liquid crystal, according to another exemplary embodiment. The display unit 130 may have any of various structures for displaying images known to a person skilled in the art.

The encapsulation layer 140 encapsulates the driver 120 and the display unit 130 together with the transparent flexible substrate 110. In an embodiment, the encapsulation layer 140 includes at least one organic layer and at least one inorganic layer. The organic layer and the inorganic layer may be alternately stacked on the display unit 130.

The encapsulation layer 140 includes a layer-type encapsulation layer according to an exemplary embodiment, and the encapsulation layer 140 may include a substrate-type encapsulation substrate according to another exemplary embodiment.

As described, a transparent display device 100 including a transparent flexible substrate 110, a driver 120, a display unit 130, and an encapsulation layer 140 is formed on the support substrate 10.

In an embodiment, a first passivation film 20 is attached to the encapsulation layer 140 of the transparent display device 100. The first passivation film 20 may prevent or substantially prevent the encapsulation layer 140 from being damaged while the support substrate 10 is separated from the transparent display device 100. In an embodiment, the first passivation film 20 may be removed when the support substrate 10 is separated from the transparent display device 100, but the present invention is not limited thereto.

Figure 3:
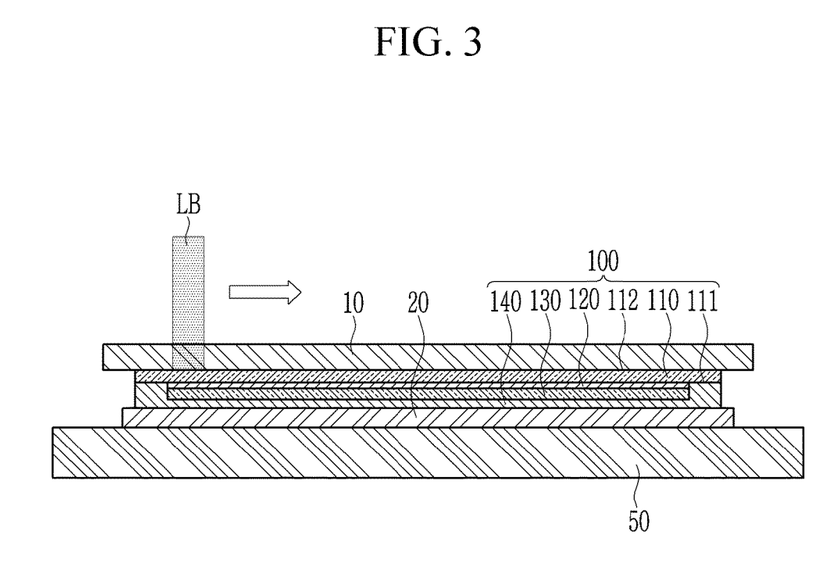

Referring to FIG. 3, the transparent flexible substrate 110 is separated from the support substrate 10 (S300).

The separating of the transparent flexible substrate 110 from the support substrate 10 includes irradiating laser beams LB to an interface of the support substrate 10 and the transparent flexible substrate 110.

In an embodiment, a stacked body including the first passivation film 20, the transparent display device 100, and the support substrate 10 is provided on a stage 50. In this instance, the first passivation film 20 is provided on a lower side to contact the stage 50, and the support substrate 10 is provided on an upper side to be spaced apart from the stage 50. The laser beams LB with an energy density (e.g., a predetermined energy density) are irradiated to the interface of the support substrate 10 and the transparent flexible substrate 110 through the support substrate 10. In this instance, the surface of the transparent flexible substrate 110 contacting the support substrate 10 absorbs the laser beams LB having the energy density, such that the transparent flexible substrate 110 of the transparent display device 100 is separated from the support substrate 10. The support substrate 10 from which the transparent flexible substrate 110 is separated is removed.

In an embodiment, the transparent flexible substrate 110 may be colored, and, in this case, an energy density of the laser beams LB may be 120 mJ/cm$^2$ to 200 mJ/cm$^2$.

When the energy density of the laser beams LB is less than 120 mJ/cm$^2$, the transparent flexible substrate 110 is not separated from the support substrate 10, and when the energy density of the laser beams LB is greater than 200 mJ/cm$^2$, the surface of the transparent flexible substrate 110 may be melted by the laser beams LB.

In an embodiment, the transparent flexible substrate 110 may be colorless, and, in this case, the energy density of the laser beams LB may be 250 mJ/cm$^2$ to 330 mJ/cm$^2$.

When the energy density of the laser beams LB is less than 250 mJ/cm$^2$, the transparent flexible substrate 110 is not separated from the support substrate 10, and when the energy density of the laser beams LB is greater than 330 mJ/cm$^2$, the surface of the transparent flexible substrate 110 may be melted by the laser beams LB.

Soot is formed on a rear side 112 of the transparent flexible substrate 110 forming an interface between the support substrate 10 and the transparent flexible substrate 110 by the laser beams LB for separating the support substrate 10.

Figure 4:
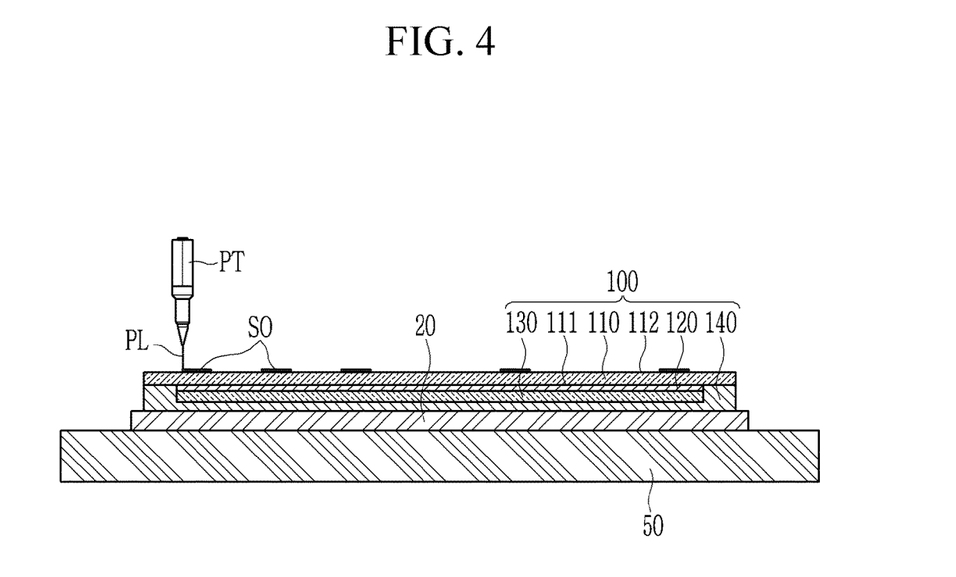
Figure 5A:
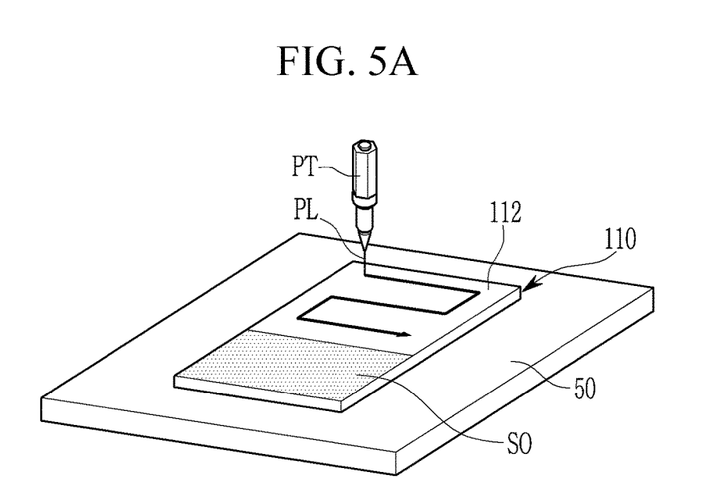
Figure 5B:
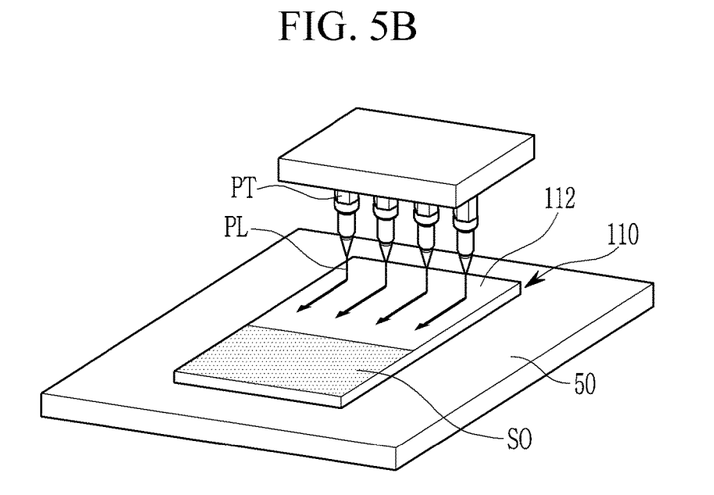
Figure 6:
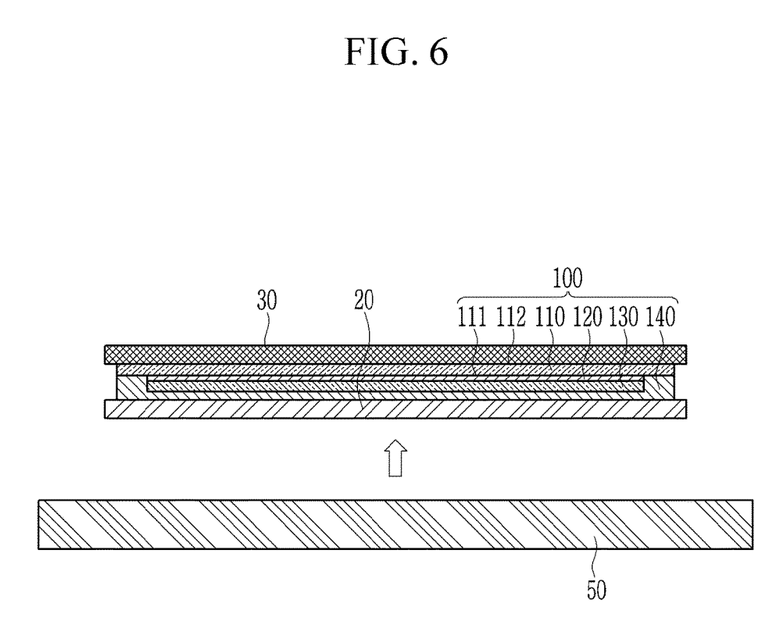

Referring to FIG. 4 to FIG. 6, the rear side 112 of the transparent flexible substrate 110 is cleaned with plasma PL (S400).

In an embodiment, referring to FIG. 4, soot SO formed on the rear side 112 of the transparent flexible substrate 110 is cleaned with plasma PL generated by a plasma torch PT. The soot SO provided on the rear side 112 of the transparent flexible substrate 110 is removed by the plasma PL. In this instance, other foreign particles that may be provided on the rear side 112 of the transparent flexible substrate 110 together with the soot SO may be removed by the plasma PL.

In an embodiment, the plasma PL may be generated by a plasma torch PT using clean dry air (CDA) including $O_2$.

The plasma torch PT may have any of various structures known to a person skilled in the art to generate the plasma PL.

In an embodiment, a power of the plasma torch PT may be 900 W to 1300 W. When the power of the plasma torch PT is less than 900 W, the soot SO provided on the rear side 112 of the transparent flexible substrate 110 is not removed by the plasma PL, and when the power of the plasma torch PT is greater than 1300 W, the rear side 112 of the transparent flexible substrate 110 may be damaged by the plasma PL.

Referring to FIG. 5A, in an embodiment, one plasma torch PT may be used, and the one plasma torch PT may move along a path, such as a predetermined zigzag-patterned path, to clean the rear side 112 of the transparent flexible substrate 110 provided on the stage 50 with the plasma PL.

Referring to FIG. 5B, in an embodiment, a plurality of plasma torches PT may be used, and the plurality of plasma torches PT may move in another direction in an assembly form disposed in one direction and may clean the rear side 112 of the transparent flexible substrate 110 provided on the stage 50 with a plurality of plasmas PL.

Referring to FIG. 6, in an embodiment, a second passivation film 30 is attached to the rear side 112 of the transparent flexible substrate 110, and the transparent display device 100 to which the first passivation film 20 and the second passivation film 30 are attached is separated from the stage 50. The second passivation film 30 may prevent or substantially prevent the rear side 112 of the transparent flexible substrate 110 of the transparent display device 100 from being damaged. The second passivation film 30 may be removed from the transparent display device 100, but the present invention is not limited thereto As described, regarding the method for manufacturing a transparent display device according to an exemplary embodiment, the soot SO is formed on the rear side 112 of the transparent flexible substrate 110 by the process using the laser beams LB for separating the transparent flexible substrate 110 from the support substrate 10 to thus deteriorate transmittance of the transparent flexible substrate 110, but the soot SO formed on the rear side 112 of the transparent flexible substrate 110 is removed by use of the plasma PL to thereby improve transmittance of the transparent flexible substrate 110, such that the transmittance-improved transparent display device 100 is manufactured.

That is, the method for manufacturing a transparent display device for manufacturing the flexible transparent display device 100 by cleaning the rear side 112 of the transparent flexible substrate 110 with plasma is provided.

Further, the transparent display device 100 manufactured by the method for manufacturing a transparent display device according to an exemplary embodiment is flexible and transparent, such that it may be attached to a curved transparent member, such as a front windshield of a vehicle, to display images for driving.

That is, the method for manufacturing a transparent display device for manufacturing the transparent display device 100 configured to be attached to a curved transparent member, such as a front windshield of the vehicle, is provided.

In an embodiment, when a fingerprint recognition region for recognizing a fingerprint of a user is provided on a front side of the transparent display device 100 and a fingerprint sensor for recognizing a fingerprint is provided on the rear side 112 of the transparent flexible substrate 110, the transparency of the transparent flexible substrate 110 included by the flexible transparent display device 100 manufactured by the method for manufacturing a transparent display device according to an exemplary embodiment allows sensing light, such as infrared rays, emitted by the fingerprint sensor to easily pass through the transparent display device 100, be reflected at the fingerprint of the user provided in the fingerprint recognition region provided on the front side of the transparent display device 100, pass through the transparent display device 100, and be easily sensed by the fingerprint sensor.

That is, the method for manufacturing a transparent display device for manufacturing the transparent display device 100 with a front side on which a fingerprint recognition region exists is provided.

Experimental results for checking effects of a method for manufacturing a transparent display device according to an exemplary embodiment will now be described with reference to FIG. 7

FIGS. 7A to 7D show graphs and tables of experimental results generated by checking effects of a method for manufacturing a transparent display device according to an exemplary embodiment.

Experimental Example 1 forms a colored transparent flexible substrate including a 10 μm-thick polyimide on a support substrate, and irradiates laser beams with an energy density of 140 mJ/cm$^2$ to 200 mJ/cm$^2$ to an interface between the support substrate and the transparent flexible substrate through the support substrate, thereby separating the transparent flexible substrate from the support substrate.

Figure 7A:
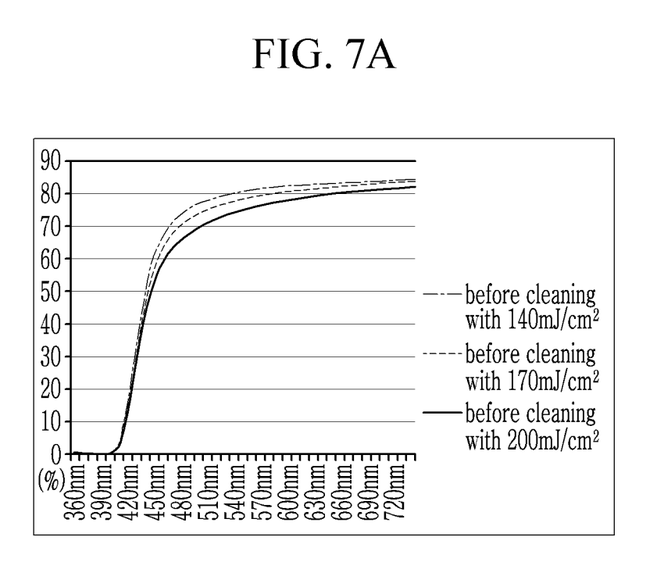
FIGS. 7A to 7D show graphs and tables of experimental results generated by checking effects of a method for manufacturing a transparent display device according to an exemplary embodiment.

FIG. 7A shows a graph of transmittance of a transparent flexible substrate separated from a support substrate by use of laser beams with energy density of 140 mJ/cm$^2$ to 200 mJ/cm$^2$. An x axis of the graph of FIG. 7A shows a wavelength of beams transmitting through the transparent flexible substrate, and a y axis thereof indicates transmittance (%) of the transparent flexible substrate.

Figure 7B:
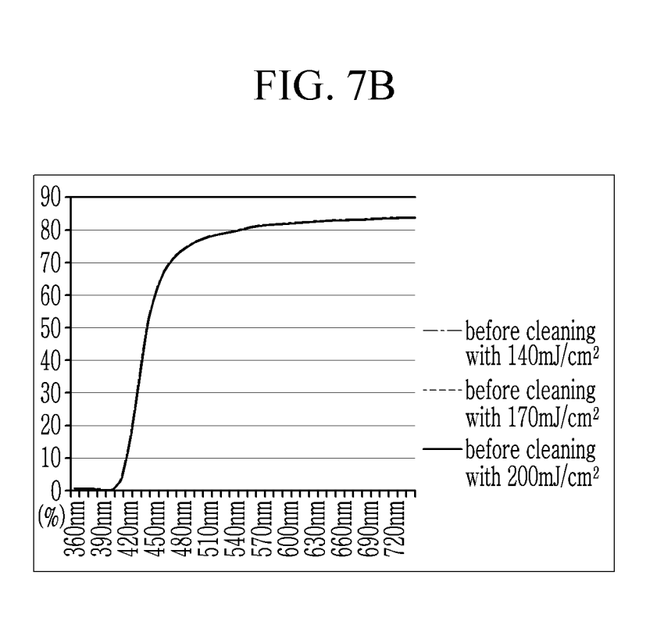

FIG. 7B shows a graph of transmittance of a transparent flexible substrate when a rear side of the transparent flexible substrate separated from the support substrate by use of laser beams with energy density of 140 mJ/cm$^2$ to 200 mJ/cm$^2$ is cleaned with plasma. An x axis of the graph of FIG. 7B shows a wavelength of beams transmitting through the transparent flexible substrate, and a y axis thereof indicates transmittance (%) of the transparent flexible substrate.

Figure 7C:
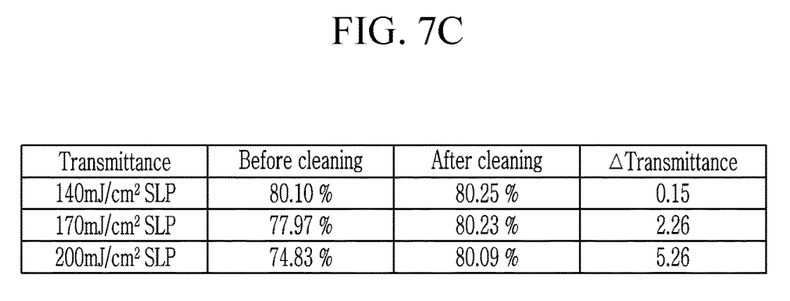

FIG. 7C shows a table of transmittance of a transparent flexible substrate before and after a rear side of a transparent flexible substrate separated from a support substrate by use of laser beams with energy density of 140 mJ/cm$^2$ to 200 mJ/cm$^2$ is cleaned with plasma.

Figure 7D:
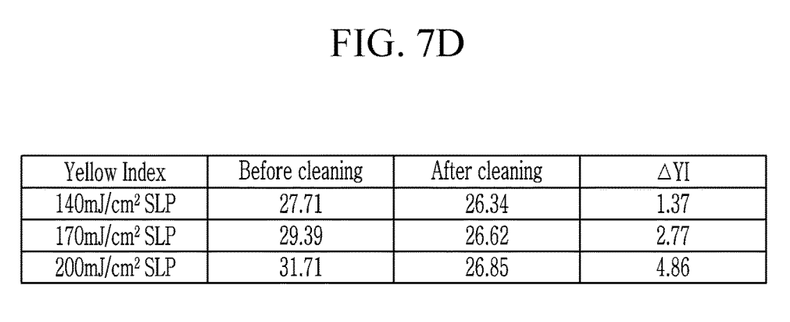

FIG. 7D shows a table of a yellow index of a transparent flexible substrate before and after a rear side of a transparent flexible substrate separated from a support substrate by use of laser beams with energy density of 140 mJ/cm$^2$ to 200 mJ/cm$^2$ is cleaned with plasma.

Referring to FIGS. 7A to 7D, it is found from Experimental Example 1 that the soot is formed on the rear side of the transparent flexible substrate by the process for separating the transparent flexible substrate from the support substrate by use of laser beams, and the transmittance of the transparent flexible substrate is deteriorated.

It is found that the transmittance of the transparent flexible substrate is improved by cleaning the rear side of the transparent flexible substrate by use of plasma and removing the soot formed on the rear side of the transparent flexible substrate.

That is, it is found that the above-described method for manufacturing a transparent display device according to an exemplary embodiment manufactures the transmittance-improved transparent display device.

A method for manufacturing a transparent display device according to another exemplary embodiment will now be described with reference to FIG. 8 to FIG. 10. Aspects and features that are different from the above-described exemplary embodiment will mainly be described.

Figure 8:
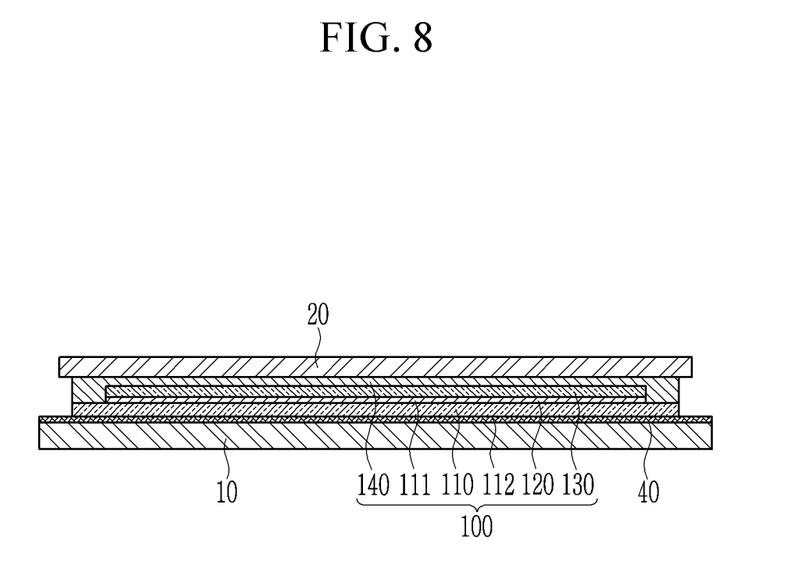
FIG. 8 to FIG. 10 show a method for manufacturing a transparent display device according to another exemplary embodiment.
Figure 9:
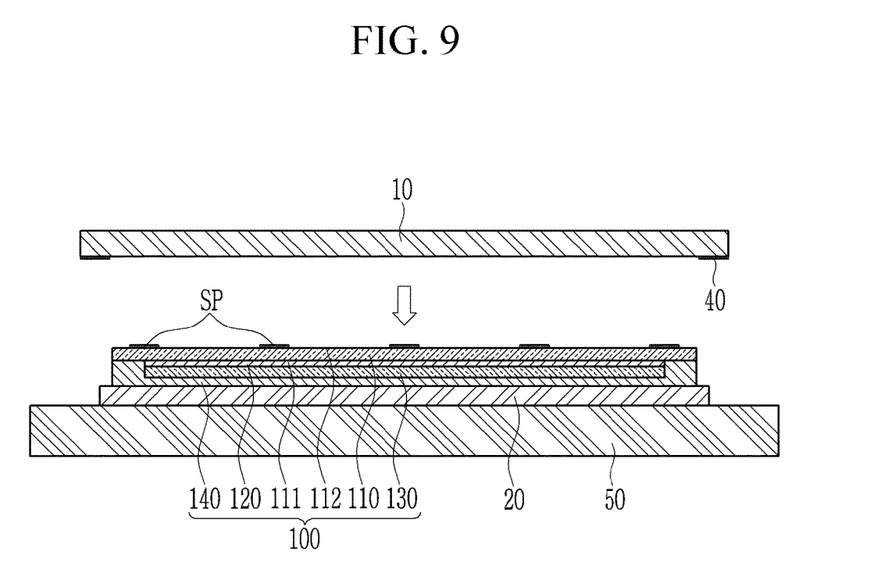
Figure 10:
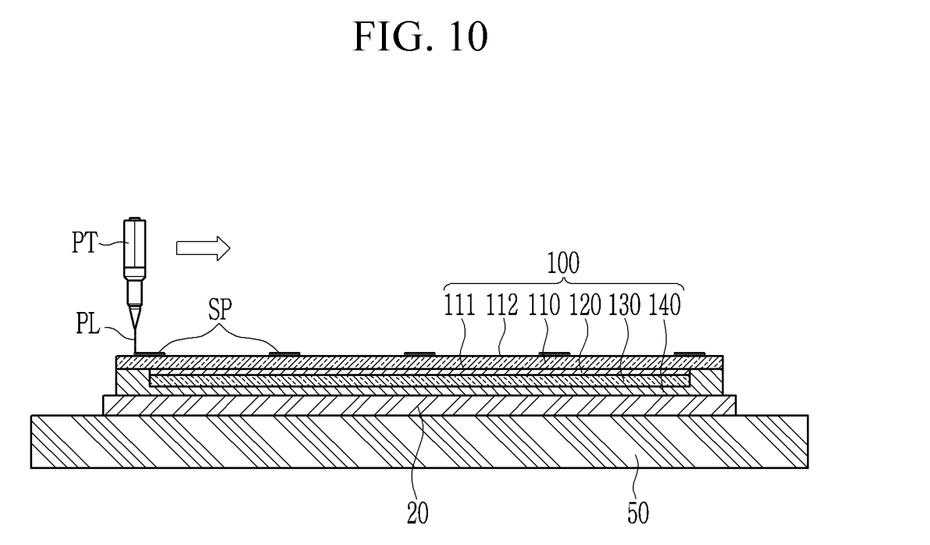

FIG. 8 to FIG. 10 show a method for manufacturing a transparent display device according to another exemplary embodiment.

Referring to FIG. 8, a transparent flexible substrate 110 is formed on a support substrate 10.

In an embodiment, a sacrificial layer 40 is provided on the support substrate 10, and the transparent flexible substrate 110 is provided on the sacrificial layer 40 such that the sacrificial layer 40 may be provided between the support substrate 10 and the transparent flexible substrate 110.

In an embodiment, the sacrificial layer 40 includes at least one of a graphene oxide and carbon nanotubes, and without being limited thereto, may include any of various sacrificial materials known to a person skilled in the art.

A display unit 130 is formed on a front side 111 of the transparent flexible substrate 110.

In an embodiment, a driver 120, a display unit 130, and an encapsulation layer 140 are sequentially formed on the front side 111 of the transparent flexible substrate 110 provided on the sacrificial layer 40.

Referring to FIG. 9, the transparent flexible substrate 110 is separated from the support substrate 10.

In further detail, the separating of the transparent flexible substrate 110 from the support substrate 10 includes separating the transparent flexible substrate 110 from the support substrate 10 by separating the sacrificial layer 40 from the support substrate 10.

In an embodiment, a stacked body including a first passivation film 20, a transparent display device 100, the sacrificial layer 40, and the support substrate 10 is provided on a stage 50. The first passivation film 20 is provided on a lower side to allow the same to contact the stage 50, and the support substrate 10 is provided on an upper side to allow the same to be spaced apart from the stage 50. The sacrificial layer 40 provided between the support substrate 10 and the transparent flexible substrate 110 may be removed by using a solution for removing the sacrificial layer 40 or a gas for removing the sacrificial layer 40.

When the sacrificial layer 40 provided between the support substrate 10 and the transparent flexible substrate 110 is removed, a remnant SP of the sacrificial layer 40 remains on the rear side 112 of the transparent flexible substrate 110. That is, the remnant SP is provided on the rear side 112 of the transparent flexible substrate 110. The remnant SP includes a sacrificial material included in the sacrificial layer 40, and the sacrificial material may include at least one of a graphene oxide and carbon nanotubes.

Referring to FIG. 10, the rear side 112 of the transparent flexible substrate 110 is cleaned with plasma PL.

In an embodiment, the remnant SP provided on the rear side 112 of the transparent flexible substrate 110 is cleaned with the plasma PL generated by a plasma torch PT. By the plasma PL, the remnant SP provided on the rear side 112 of the transparent flexible substrate 110 is removed. In this instance, other foreign particles that may be provided on the rear side 112 of the transparent flexible substrate 110 together with the remnant SP may also be removed by the plasma PL.

In an embodiment, a power of the plasma torch PT may be 900 W to 1300 W. When the power of the plasma torch PT is less than 900 W, the remnant SP provided on the rear side 112 of the transparent flexible substrate 110 is not removed by the plasma PL, and when the power of the plasma torch PT is greater than 1300 W, the rear side 112 of the transparent flexible substrate 110 may be damaged by the plasma PL.

In an embodiment, a second passivation film is attached to the rear side 112 of the transparent flexible substrate 110, and the transparent display device 100 to which the first passivation film 20 and the second passivation film are attached is separated from the stage 50. The second passivation film may prevent or substantially prevent the rear side 112 of the transparent flexible substrate 110 of the transparent display device 100 from being damaged. In an embodiment, the second passivation film may be removed from the transparent display device 100, but the present invention is not limited thereto As described, the method for manufacturing a transparent display device according to another exemplary embodiment allows the remnant SP to be provided on the rear side 112 of the transparent flexible substrate 110 by the process for removing the sacrificial layer 40 provided between the support substrate 10 and the transparent flexible substrate 110 and, accordingly, separating the transparent flexible substrate 110 from the support substrate 10, thereby deteriorating the transmittance of the transparent flexible substrate 110, but it removes the remnant SP provided on the rear side 112 of the transparent flexible substrate 110 by use of the plasma PL to thus improve the transmittance of the transparent flexible substrate 110, such that it manufactures the transmittance-improved transparent display device 100.

That is, the method for manufacturing a transparent display device for manufacturing the flexible transparent display device 100 by cleaning the rear side 112 of the transparent flexible substrate 110 with plasma is provided.

Experimental results for checking effects of a method for manufacturing a transparent display device according to another exemplary embodiment will now be described with reference to FIGS. 11A to 11C.

Figure 11A:
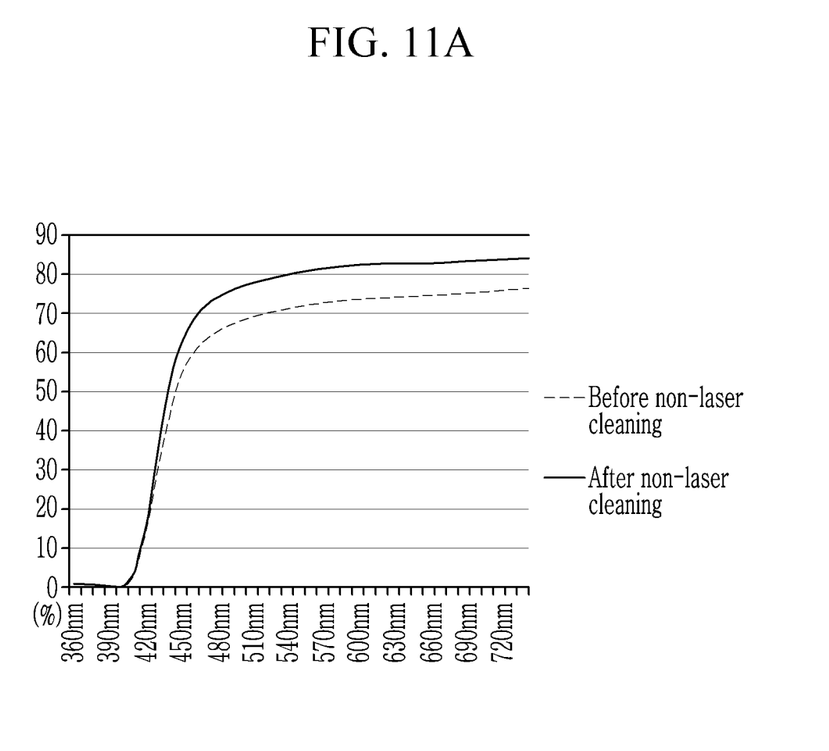
FIGS. 11A to 11C show a graph and tables of experimental results generated by checking effects of a method for manufacturing a transparent display device according to another exemplary embodiment.
Figure 11B:
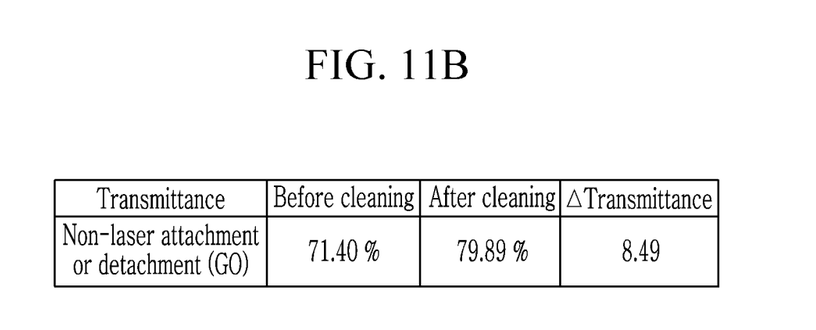
Figure 11C:
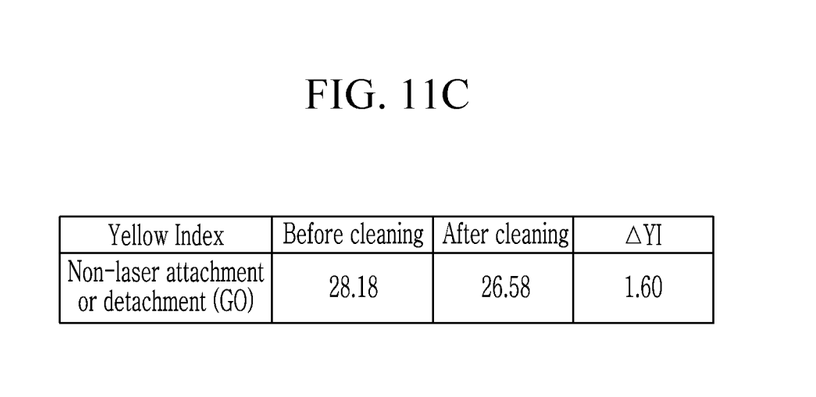

FIGS. 11A to 11C show a graph and tables of experimental results generated by checking effects of a method for manufacturing a transparent display device according to another exemplary embodiment.

Experimental Example 2 forms a colored transparent flexible substrate including a graphene oxide layer and a 10 µm-thick polyimide on the support substrate, and removes the graphene oxide layer provided between the support substrate and the transparent flexible substrate to thus separate the transparent flexible substrate from the support substrate.

FIG. 11A shows a graph of transmittance of a transparent flexible substrate before (i.e. before non-laser cleaning) and after (i.e. after non-laser cleaning) the graphene oxide layer is removed and the rear side of the transparent flexible substrate separated from the support substrate is cleaned with plasma. An x axis of the graph of FIG. 11A shows a wavelength of beams transmitting through the transparent flexible substrate, and a y axis thereof indicates transmittance (%) of the transparent flexible substrate.

FIG. 11B shows a table of transmittance of a transparent flexible substrate before and after the graphene oxide layer is removed and the rear side of the transparent flexible substrate (non-laser attachment or detachment (GO)) separated from the support substrate is cleaned with plasma.

FIG. 11C shows a table for indicating a yellow index of a transparent flexible substrate before and after the graphene oxide layer is removed and the rear side of the transparent flexible substrate (non-laser attachment or detachment (GO)) separated from the support substrate is cleaned with plasma.

Referring to FIG. 11, it is found from Experimental Example 2 that the remnant of the graphene oxide layer is provided on the rear side of the transparent flexible substrate by the process for removing the graphene oxide layer and separating the transparent flexible substrate from the support substrate, and the transmittance of the transparent flexible substrate is deteriorated.

It is found that the transmittance of the transparent flexible substrate is improved by cleaning the rear side of the transparent flexible substrate by use of plasma and removing the remnant of the graphene oxide layer provided on the rear side of the transparent flexible substrate.

That is, it is found that the above-described method for manufacturing a transparent display device according to another exemplary embodiment manufactures the transmittance-improved transparent display device.

While some embodiments of this invention have been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a transparent display device, the method comprising:
   providing a transparent flexible substrate on a support substrate;
   forming a display unit on a front side of the transparent flexible substrate;
   separating the transparent flexible substrate from the support substrate; and
   cleaning a rear side of the transparent flexible substrate with plasma.

2. The method of claim 1, wherein the separating of the transparent flexible substrate includes irradiating laser beams to an interface of the support substrate and the transparent flexible substrate through the support substrate.

3. The method of claim 2, wherein
   the transparent flexible substrate is colored, and
   an energy density of the laser beams is 120 mJ/cm$^2$ to 200 mJ/cm$^2$.

4. The method of claim 2, wherein
   the transparent flexible substrate is colorless, and
   an energy density of the laser beams is 250 mJ/cm$^2$ to 330 mJ/cm$^2$.

5. The method of claim 2, wherein the cleaning of the rear side of the transparent flexible substrate with plasma includes removing soot provided on the rear side of the transparent flexible substrate.

6. The method of claim 1, further comprising providing a sacrificial layer on the support substrate such that the sacrificial layer is provided between the support substrate and the transparent flexible substrate.

7. The method of claim 6, wherein the separating of the transparent flexible substrate includes separating the sacrificial layer from the support substrate.

8. The method of claim 6, wherein the sacrificial layer includes a graphene oxide or carbon nanotubes.

9. The method of claim 6, wherein the cleaning of the rear side of the transparent flexible substrate with plasma includes removing a remnant of the sacrificial layer provided on the rear side of the transparent flexible substrate.

10. The method of claim 1, wherein the cleaning with plasma is performed by using a plasma torch using clean dry air including $O_2$.

11. The method of claim 10, wherein a power of the plasma torch is 900 W to 1300 W.

* * * * *